(12) United States Patent
Cheng et al.

(10) Patent No.: US 9,276,549 B1
(45) Date of Patent: Mar. 1, 2016

(54) VIA SYSTEM OF PRINTED CIRCUIT BOARD AND METHOD OF MAKING SAME

(71) Applicant: ScienBiziP Consulting (Shen Zhen) Co., Ltd., Shenzhen (CN)

(72) Inventors: Ming-Hsien Cheng, New Taipei (TW);
Po-Chuan Hsieh, New Taipei (TW);
Ying-Tso Lai, New Taipei (TW);
Chien-Hsun Chen, New Taipei (TW)

(73) Assignee: ScienBiziP Consulting(Shenzhen)Co., Ltd., Shenzhen (CN)

( * ) Notice: Subject to any disclaimer, the term of this patent is extended or adjusted under 35 U.S.C. 154(b) by 0 days.

(21) Appl. No.: 14/485,312

(22) Filed: Sep. 12, 2014

(51) Int. Cl.
H05K 1/11 (2006.01)
H03H 7/38 (2006.01)
G06F 17/50 (2006.01)

(52) U.S. Cl.
CPC .............. *H03H 7/38* (2013.01); *G06F 17/5077* (2013.01); *H05K 1/115* (2013.01)

(58) Field of Classification Search
CPC ....... H05K 1/111; H05K 1/112; H05K 1/115; H05K 3/429; H05K 3/4069; H05K 3/4066; H05K 3/3447; H05K 2201/096; H05K 2201/0355; H05K 3/34527; H05K 2924/3011; H05K 2201/09781
USPC .................. 174/262–266, 250, 261
See application file for complete search history.

(56) References Cited

U.S. PATENT DOCUMENTS

| | | | | |
|---|---|---|---|---|
| 2005/0202722 A1* | 9/2005 | Regnier | ................ | H05K 1/0222 439/607.05 |
| 2006/0158280 A1* | 7/2006 | Jow | .......................... | H01L 23/66 333/33 |
| 2010/0078211 A1* | 4/2010 | Kim | ...................... | H05K 1/0245 174/262 |
| 2011/0011637 A1* | 1/2011 | Yoshinaga | ........... | H05K 1/0216 174/262 |
| 2011/0037556 A1* | 2/2011 | Pai | ...................... | H01F 17/0013 336/200 |
| 2012/0019106 A1* | 1/2012 | Spigelmyer | ........... | B06B 1/0292 310/348 |
| 2012/0325542 A1* | 12/2012 | Yokoyama | ........... | H05K 1/0251 174/262 |
| 2013/0098671 A1* | 4/2013 | Thurairajaratnam | .. | H05K 1/024 174/266 |
| 2013/0112470 A1* | 5/2013 | Ao | ........................ | H05K 1/115 174/266 |
| 2013/0272363 A1* | 10/2013 | Hsieh | ..................... | H04L 25/03 375/229 |
| 2014/0125435 A1* | 5/2014 | Tsai | ........................ | H04B 3/14 333/28 R |
| 2014/0305688 A1* | 10/2014 | Matsumoto | ............ | H05K 1/115 174/262 |

\* cited by examiner

*Primary Examiner* — Hoa C Nguyen

(74) *Attorney, Agent, or Firm* — Novak Druce Connolly Bove + Quigg LLP

(57) ABSTRACT

A printed circuit board (PCB) includes a top outer layer, a bottom outer layer, a signal transmission layer, an inner signal transmission layer, and a via system defined in the PCB. The via system includes two pairs of vias configured to transmit signals from a transmitter to a receiver. A signal transmission pathway is defined in the top outer layer, the signal transmission layer, and the inner signal transmission layer. Signals are sent from the transmitter to a first pair of vias, the signals are transmitted from the first pair of vias to a second pair of vias, and the signals are sent from the second pair of vias to the receiver. The two pairs of vias and the signal transmission pathway provide impedance matching to the signals.

20 Claims, 8 Drawing Sheets

VIA SYSTEM OF PRINTED CIRCUIT BOARD AND METHOD OF MAKING SAME

FIELD

The present disclosure relates to printed circuit boards, and particularly to a printed circuit board defining a via system therein to provide impedance matching for signal transmissions.

BACKGROUND

In printed circuit boards, signals are often transmitted through vias defined in the printed circuit boards. The signals may encounter impedance during signal transmission through the printed circuit boards.

BRIEF DESCRIPTION OF THE DRAWINGS

Implementations of the present technology will now be described, by way of example only, with reference to the attached figures.

DETAILED DESCRIPTION

Figure 1:
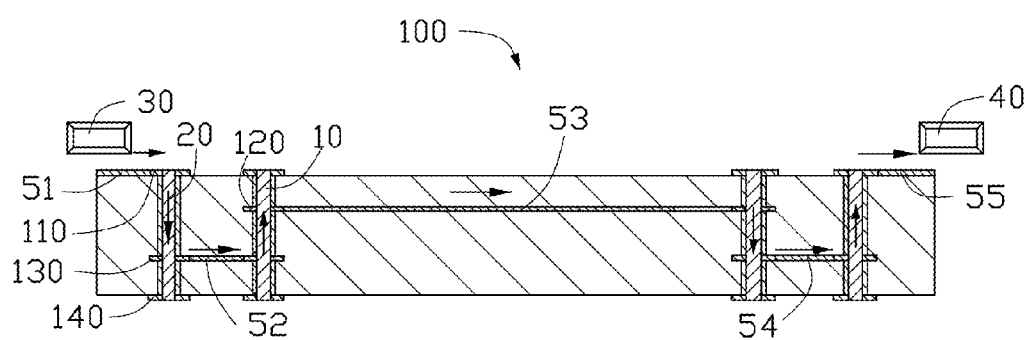
FIG. 1 is a side-plan view of an exemplary embodiment of a printed circuit board defining a via system therein.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "substantially" is defined to be essentially conforming to the particular dimension, shape or other word that substantially modifies, such that the component need not be exact. For example, substantially cylindrical means that the object resembles a cylinder, but can have one or more deviations from a true cylinder. The term "comprising" means "including, but not necessarily limited to"; it specifically indicates open-ended inclusion or membership in a so-described combination, group, series and the like.

FIG. 1 illustrates an exemplary embodiment of a printed circuit board (PCB) 100 including a via system (not labeled) defined therein. The via system can include two first vias 10 and two second vias 20. One of the first vias 10 and one of the second vias 20 can constitute a first pair of vias (not labeled) for receiving signals from a transmitter 30. The other first via 10 and the other second via 20 can constitute a second pair of vias (not labeled) for receiving the signals from the first pair of vias and sending the signals to a receiver 40.

The PCB 100 can further define a plurality of signal transmission pathways (not labeled) for transmitting the signals from the transmitter 30 to the receiver 40. The signal transmission pathways can include a first signal transmission pathway 51, a second signal transmission pathway 52, a third signal transmission pathway 53, a fourth signal transmission pathway 54, and a fifth signal transmission pathway 55. The first signal transmission pathway 51 can connect the transmitter 30 to the second via 20 of the first pair of vias. The second signal transmission pathway 52 can connect the second via 20 of the first pair of vias to the first via 10 of the first pair of vias. The third signal transmission pathway 53 can connect the first via 10 of the first pair of vias to the first via 10 of the second pair of vias. The fourth signal transmission pathway 54 can connect the first via 10 of the second pair of vias to the second via 20 of the second pair of vias. The fifth signal transmission pathway 55 can connect the second via 20 of the second pair of vias to the receiver 40.

In at least one embodiment, the PCB 100 can include a signal input layer 110, a signal transmission layer 120, an inner signal transmission layer 130, and a bottom outer layer 140. The signal input layer 110 can be a top outer layer of the PCB 100, and the signal transmission layer 120 can be located between the signal input layer 110 and the inner signal transmission layer 130. The first signal transmission pathway 51 and the fifth signal transmission pathway 55 can be defined in the signal input layer 110, the second signal transmission pathway 52 and the fourth signal transmission pathway 54 can be defined in the inner signal transmission layer 130, and the third signal transmission pathway 53 can be defined in the signal transmission layer 120. Because the second pair of vias is similar to the first pair of vias, for simplicity of illustration, the first pair of vias will be mainly described below.

Figure 2:
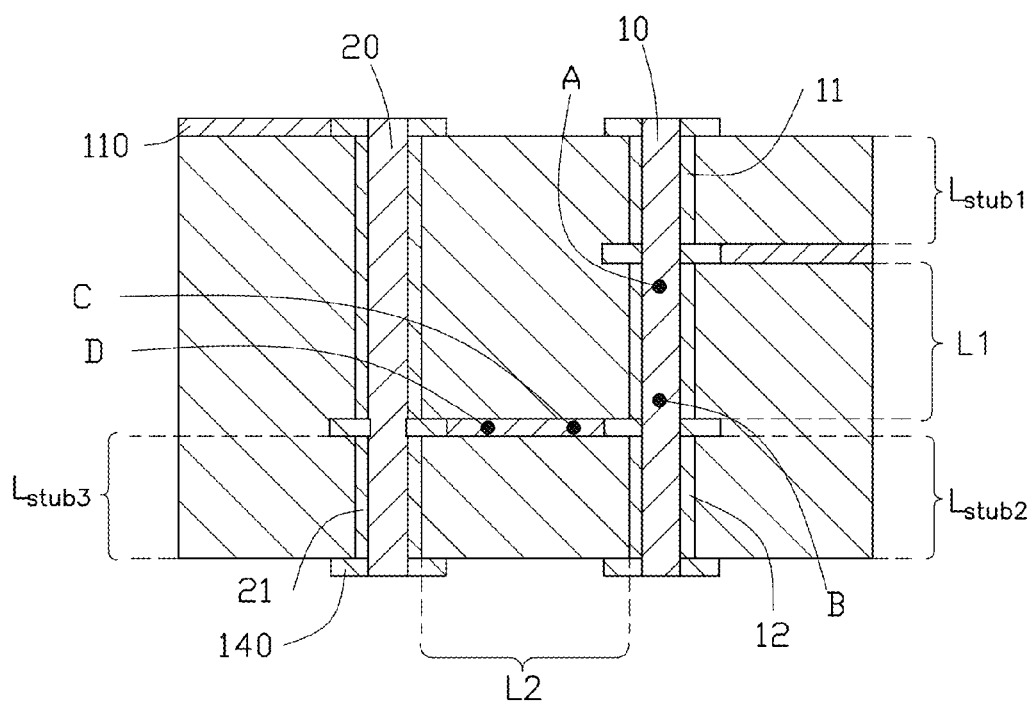
FIG. 2 is a side-plan view of an exemplary embodiment of a first pair of vias of the via system.

Referring to FIG. 2, the first via 10 can include a first via stub 11 having a length $L_{stub1}$, and a second via stub 12 having a length $L_{stub2}$. The second via 20 can include a third via stub 21 having a length $L_{stub3}$. The first via stub 11, the second via stub 12, and the third via stub 21 can be open via stubs. The first via stub 11 can open through the signal input layer 110, and the second via stub 12 and the third via stub 21 can open through the bottom outer layer 140. In at least one embodiment, the length $L_{stub2}$ is equal to the length $L_{stub3}$.

Figure 5:
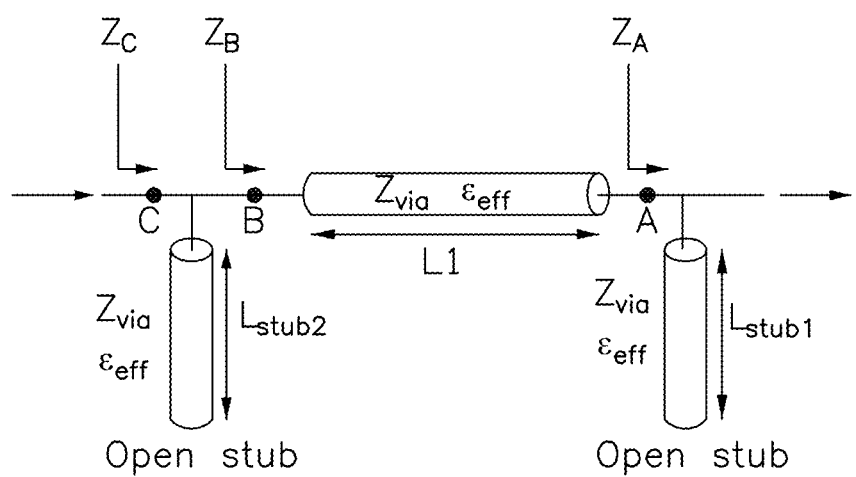
FIG. 5 is a diagrammatic view of an exemplary embodiment of signal transmission through the via system.
Figure 6:
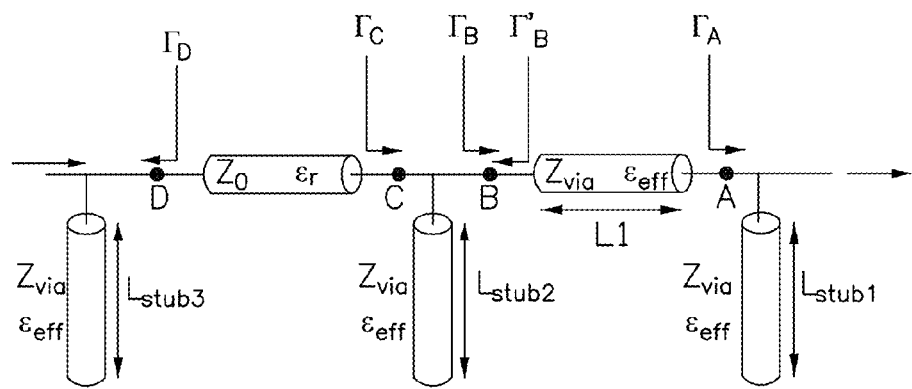
FIG. 6 is similar to FIG. 5.

Referring to FIG. 2 and FIGS. 5-6, a first length L1 is defined as a length of the first via 10 between the first via stub 11 and the second via stub 12. A second length L2 is defined as a length of the second signal transmission pathway 52 between the first via 10 and the second via 20. All vias of the via system can include a characteristic impedance $Z_{via}$, and the via system can include a differential impedance $Z_0$. By adjusting the first length L1 and the second length L2, signal transmission of the signals through the via system can be optimized.

The first via 10 can include a first point A located adjacent to the first via stub 11, and a second point B located adjacent to the second via stub 12. The second signal transmission pathway 52 can include a third point C located adjacent to the second via stub 12, and a fourth point D located adjacent to the third via stub 21. The first via stub 11 and the second via stub 12 have a capacitive characteristic. The first point A, the second point B, and the third point C can provide an input impedance to the signals. The input impedance of the second point B can have an inductive characteristic. The capacitive characteristic of the second via stub 12 and the inductive characteristic of the input impedance of the second point can cooperatively create a capacitive/inductive offset effect on the third point C. The input impedance of the first point A can have a capacitive characteristic. The input impedance of the second point B and the input impedance of the first point A can cooperatively create an impedance matching effect on the signals.

Figure 3:
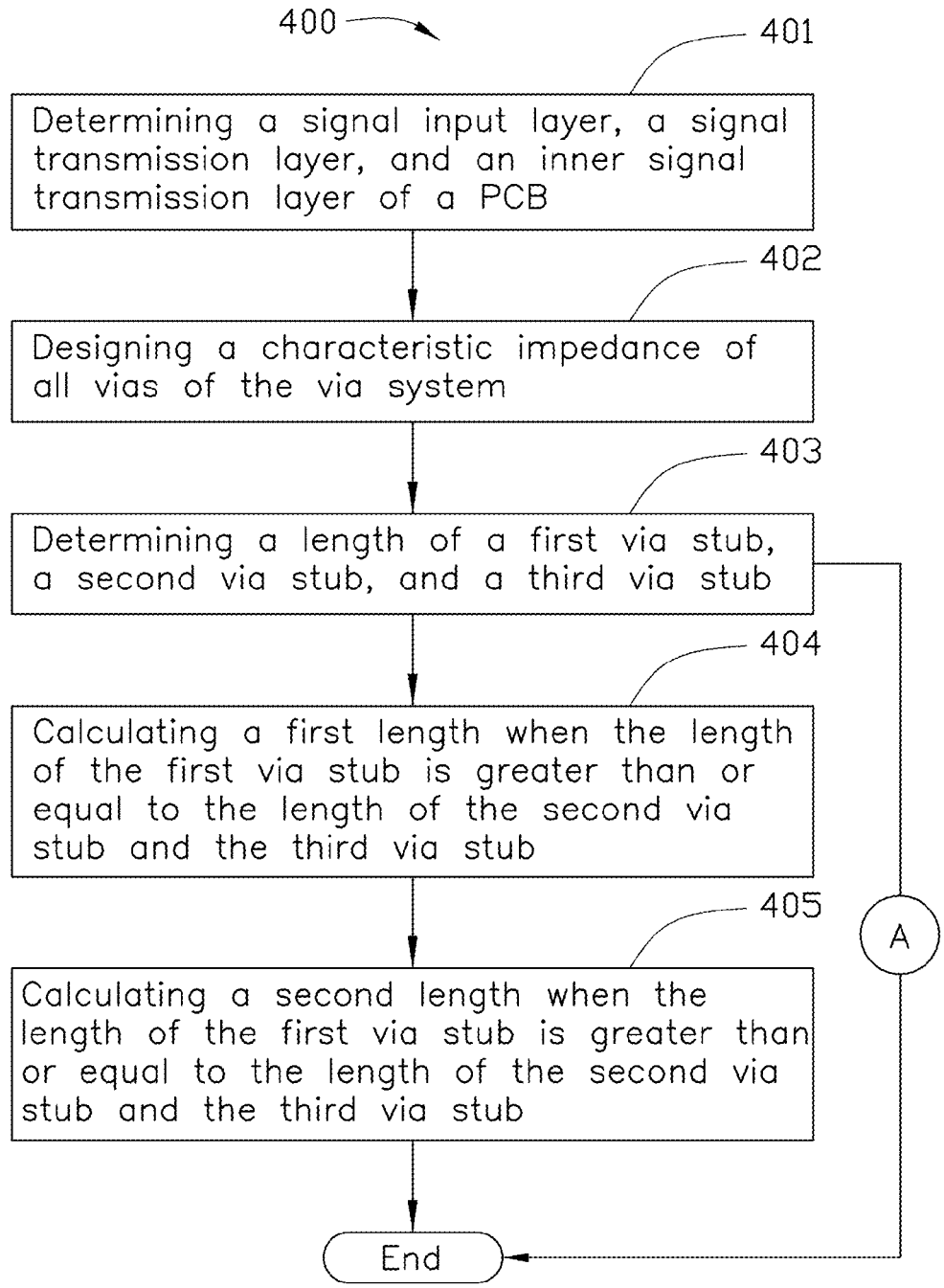
FIGS. 3-4 are a flowchart of an exemplary embodiment of a method for defining the via system in the printed circuit board.
Figure 4:
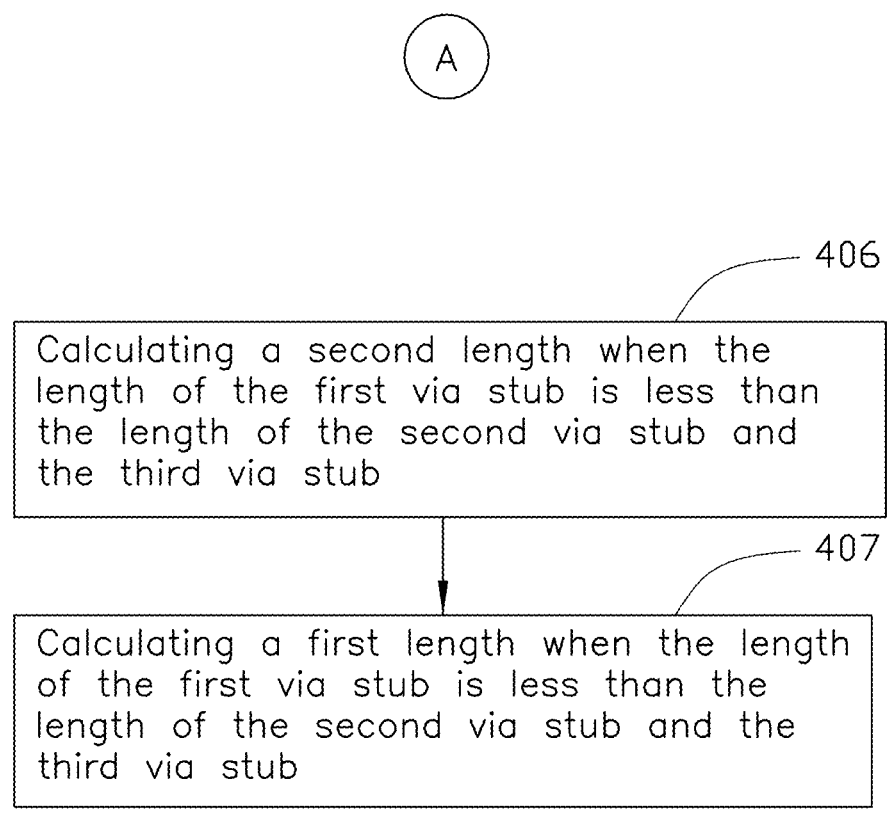

FIGS. 3-4 illustrate a method for designing a via system of a printed circuit board (PCB). The method is provided by way of example, as there are a variety of ways to carry out the method. The method described below can be carried out using the configurations illustrated in FIGS. 1-2 and 5-6, for example, and various elements of these figures are referenced in explaining the example method. Each block shown in FIGS. 3-4 represents one or more processes, methods, or subroutines carried out in the example method. Additionally, the illustrated order of blocks is by example only and the order of the blocks can be changed. The example method can begin at block 401.

At block 401, a signal input layer, a signal transmission layer, and an inner signal transmission layer of a PCB are determined. The signal input layer can be a top outer layer of the PCB, and the signal transmission layer can be located between the signal input layer and the inner signal transmission layer. A first via stub and a second via stub can be located at opposite end portions of a first via. The first via stub can open through the top outer layer of the PCB, and the second via stub can open through a bottom outer layer of the PCB. A third via stub can be located at an end portion of a second via and can open through the bottom layer of the PCB. The PCB can include two pairs of vias defined therein. Each pair of vias can include a corresponding first via and a corresponding second via.

At block 402, a characteristic impedance of all vias of the via system can be designed. The characteristic impedance of the vias can be designed to be higher than a differential impedance of the via system of the PCB. For example, if the differential impedance is 100 ohms, a value of the characteristic impedance is designed to be from 100 ohms to 130 ohms. In this way, a capacitive characteristic of the first, second, and third via stubs is reduced, and impedance matching on signal transmission is enhanced, thereby reducing insertion loss.

At block 403, lengths of the first via stub, the second via stub, and the third via stub can be determined. In at least one embodiment, the lengths of the second via stub and the third via stub are equal to each other. When the length of the first via stub is greater than or equal to the length of the second via stub and third via stub, block 404 is implemented. When the length of the first via stub is less than the length of the second via stub and the third via stub, block 406 is implemented.

At block 404, a first length can be calculated. The first length can be defined as a length of the first via between the first and second via stubs. The first length can be calculated according to the following formula:

$$L1 = \frac{(\pi - |\Delta \Gamma_A|)c}{2\pi f_1 \sqrt{\varepsilon_{eff}}}$$

wherein L1 is the first length, $f_1$ is set to be less than the quarter wavelength resonant frequency of the first via stub, $\Gamma_A$ is a reflection coefficient of a first point in the via system, $\varepsilon_{eff}$ is the equivalent permittivity, and $c=3\times10^8$ m/s. The first point can be located in the first via and be adjacent to the first via stub.

$\Gamma_A$ can be calculated according to the following formula:

$$\Gamma_A = \frac{-jZ_0 \tan\frac{2\pi f_1 \sqrt{\varepsilon_{eff}}}{c} L_{stub1}}{2Z_{via} + jZ_0 \tan\frac{2\pi f_1 \sqrt{\varepsilon_{eff}}}{c} L_{stub1}}$$

wherein $Z_0$ is the differential impedance of the via system, and $Z_{via}$ is the characteristic impedance of all the vias of the via system.

A value of the first length can be adjusted according to signal requirements in order to obtain a maximum −3 dB insertion loss bandwidth. The value of the first length can be represented by the following relationship:

$$\tfrac{1}{2}L_{stub1} \leq L1 \leq 2*L_{stub1}$$

wherein $L_{stub1}$ is the length of the first via stub.

At block 405, a second length can be calculated. The second length can be defined as a length of a signal transmission pathway between the first via and the second via. The second length can be calculated according to the following formula:

$$L2 = \frac{(2\pi + \Delta\Gamma_C + \Delta\Gamma_A)c}{4\pi(f_2)\sqrt{\varepsilon_r}}$$

wherein L2 is the second distance, $f_2$ is set to be less than $f_1$, and $\Gamma_A$ and $\Gamma_C$ are reflection coefficients of a first point and a third point, respectively, of the via system when the operating frequency equals $f_2$. The first point can be located in the first via and be adjacent to the first via stub, and the third point can be located in the signal transmission pathway between the first via and the second via and can be adjacent to the second via stub. A value of the second length can be adjusted according to a simulation in order to obtain an optimal bandwidth, and the value of the second length can be represented by the following relationship:

$$\tfrac{1}{2}L_{stub1} \leq L2 \leq 2*L_{stub1}$$

At block 406, a second length can be calculated according to the following formula:

$$L2 = \frac{(\pi - |\Delta\Gamma_D|)c}{2\pi f_1 \sqrt{\varepsilon_{eff}}}$$

wherein L2 is the second length, $f_1$ is set to be less than the quarter wavelength resonant frequency of the second via stub, $\Gamma_D$ is a reflection coefficient of a fourth point of the signal transmission line, $\varepsilon_{eff}$ is the equivalent permittivity, and $c=3\times10^8$ m/s. The fourth point can be located in the signal transmission pathway between the first via and a second via and can be adjacent to the third via stub.

$\Gamma_D$ can be calculated according to the following formula:

$$\Gamma_D = \frac{-jZ_0 \tan\frac{2\pi f_1 \sqrt{\varepsilon_{eff}}}{c} L_{stub2}}{2Z_{via} + jZ_0 \tan\frac{2\pi f_1 \sqrt{\varepsilon_{eff}}}{c} L_{stub2}}$$

wherein $Z_0$ is the differential impedance of the via system, and $Z_{via}$ is the characteristic impedance of all the vias of the via system.

A value of the second length can be adjusted according to signal requirements in order to obtain a maximum −3 dB insertion loss bandwidth. The value of the second length can be represented by the following relationship:

$$\tfrac{1}{2}L_{stub2} \leq L2 \leq 2*L_{stub2}$$

wherein $L_{stub2}$ is the length of the second via stub.

At block 407, a first length can be calculated. The first length can be defined as a length of the first via between the first via stub and the second via stub. The first distance can be calculated according to the following formula:

$$L1 = \frac{(2\pi + \varDelta \Gamma_D + \varDelta \Gamma'_B)c}{4\pi(f_2)\sqrt{\varepsilon_r}}$$

wherein L1 is the first distance, $f_2$ is set to be less than $f_1$, and $\Gamma_{B'}$ and $\Gamma_D$ are reflection coefficients of a second point and a fourth point, respectively, of the via system when the operating frequency equals $f_2$. The first point can be located in the first via and be adjacent to the first via stub, and the third point can be located in the signal transmission pathway between the first via and the second via and can be adjacent to the first via.

A value of the first length can be adjusted according to a simulation in order to obtain an optimal bandwidth. The value of the first length can be represented by the following relationship:

$$\tfrac{1}{2}L_{stub2} \leq L1 \leq 2*L_{stub2}$$

Figure 7:
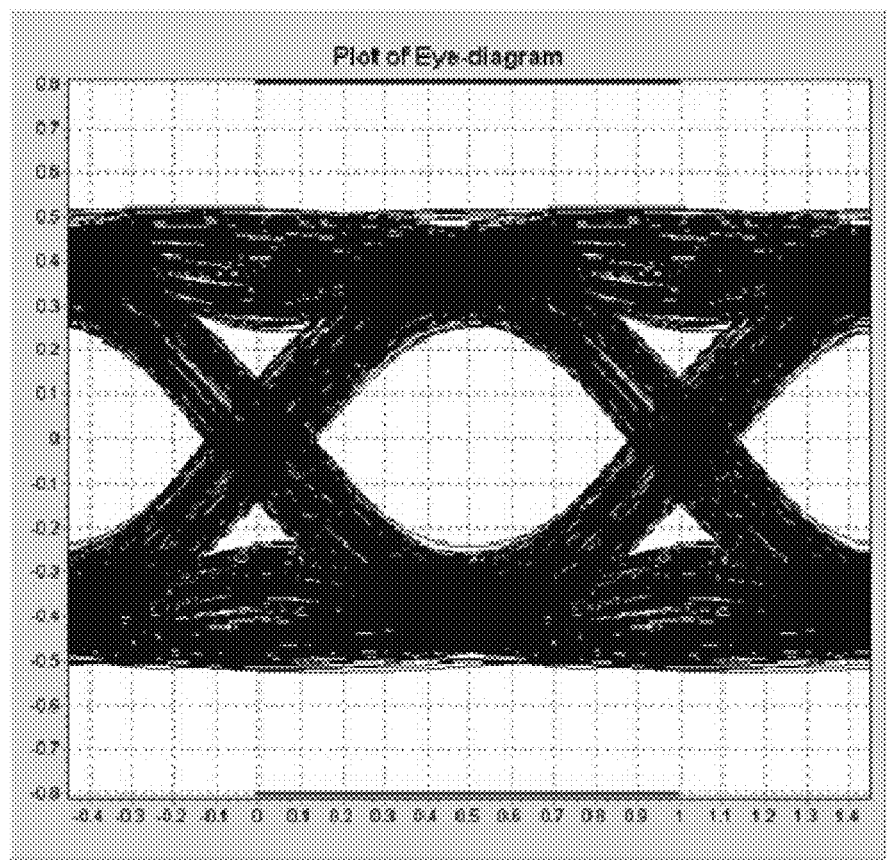
FIG. 7 is an eye-diagram of signal transmission through the via system.
Figure 8:
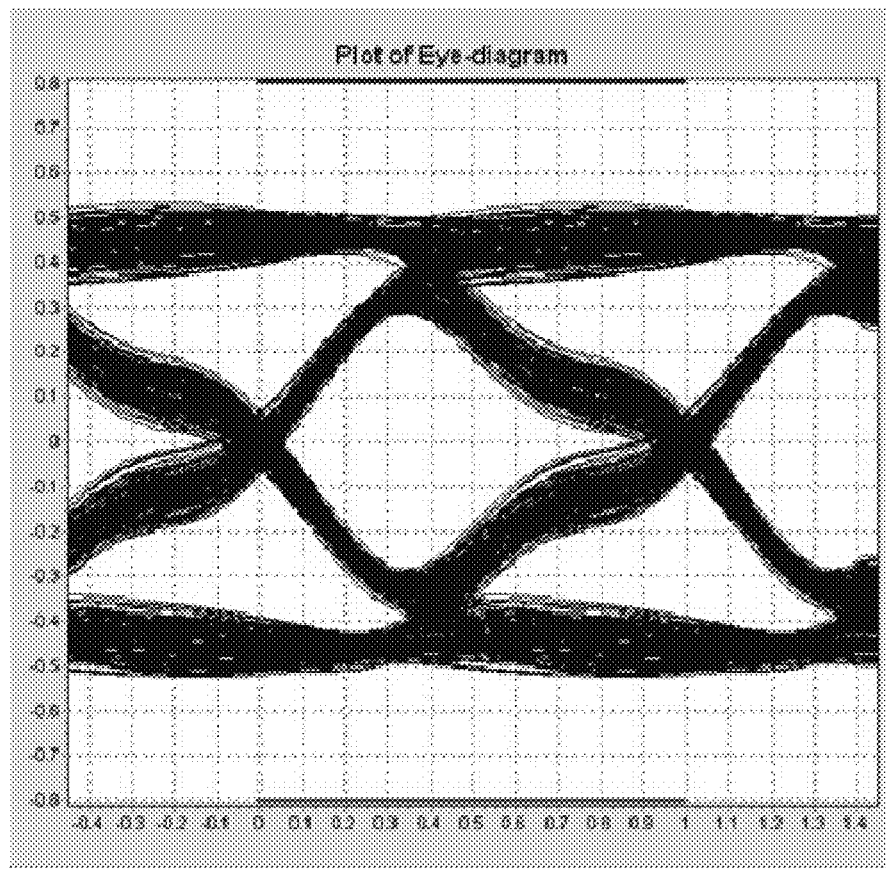
FIG. 8 is an eye-diagram of signal transmission through a conventional printed circuit board.

FIG. 7 illustrates an eye-diagram of signals transmitted through the PCB 100 of the present disclosure. FIG. 8 illustrates an eye-diagram of signals transmitted through a conventional PCB. As can be seen in FIG. 7, the impedance matching provided by the PCB 100 of the present disclosure results in higher quality signal transmission.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including, the full extent established by the broad general meaning of the terms used in the claims.

What is claimed is:

1. A printed circuit board (PCB) comprising:
a top outer layer;
a bottom outer layer;
a signal transmission layer;
an inner signal transmission layer; and
a via system defined in the PCB;
wherein the via system is configured for routing a signal transmission line and comprises a first pair of vias and a second pair of vias, the first pair of vias and the second pair of vias each comprising a first via and a second via; the first via and the second via both extend through the top outer layer, the signal transmission layer, the inner signal transmission layer, and the bottom outer layer; the second via is located closer to a side edge of the PCB than the first via; a first signal transmission pathway of the via system is defined in the top outer layer and connects a transmitter to the second via of a first pair of vias; a second signal transmission pathway of the via system is defined in the inner signal transmission layer and connects the second via of the first pair of vias to the first via of the first pair of vias; a third signal transmission pathway of the via system is defined in the signal transmission layer and connects the first via of the first pair of vias to the first via of the second pair of vias; a fourth signal transmission pathway of the via system is defined in the inner signal transmission layer and connects the first via of the second pair of vias to the second via of the second pair of vias; a fifth signal transmission pathway of the via system is defined in the top outer layer and connects the second via of the second pair of vias to a receiver;
a signal is sent from the transmitter to the second via of the first pair of vias through the first signal transmission pathway; the signal is transmitted from the second via of the first pair of vias to the first via of the first pair of vias through the second signal transmission pathway; the signal is transmitted from the first via of the first pair of vias to the first via of the second pair of vias through the third signal transmission pathway; the signal is transmitted from the first via of the second pair of vias to the second via of the second pair of vias through the fourth signal transmission pathway; and the signal is transmitted from the second via of the second pair of vias to the receiver through the fifth signal transmission pathway.

2. The PCB as in claim 1, wherein the top outer layer, the bottom outer layer, the signal transmission layer, and the inner signal transmission layer are substantially parallel to each other, and the signal transmission layer is located between the top outer layer and the inner signal transmission layer.

3. The PCB as in claim 2, wherein the first via of each pair of vias comprises a first via stub and a second via stub, and the second via of each pair of vias comprises a third via stub; the first via stub and the second via stub are open stubs, the first via stub opening through the top outer layer, and the second via stub opening through the bottom outer layer; the third via stub is an open via stub opening through the bottom outer layer; a first length is defined as a length of the first via between the first via stub and the second via stub, and a second length is defined as a distance between the first via and the second via of each pair of vias.

4. The PCB as in claim 3, wherein the first distance comprises a first point and a second point, the first point being located adjacent to the first via stub, and the second point being located adjacent to the second via stub; the second distance comprises a third point located adjacent to the second via stub; the first point, the second point, and the third point each provide an input impedance to the signals, and the signals have a reflection coefficient at each of the first, second, and third points.

5. The PCB as in claim 4, wherein the first via stub and the second via stub have a capacitive characteristic, and the input impedance of the second point has an inductive characteristic; the capacitive characteristic of the second via stub and the inductive characteristic of the input impedance of the second point cooperatively create a capacitive/inductive offset effect on the third point; the input impedance of the first point has a capacitive characteristic; and the input impedance of the second point and the input impedance of the first point cooperatively create an impedance matching effect on the signal.

6. A method for designing a via system of a printed circuit board (PCB), the method comprising;

determining a signal input layer, a signal transmission layer, and an inner signal transmission layer of the PCB;

designing a characteristic impedance of all vias of the via system;

determining a length of a first via stub, a second via stub, and a third via stub;

calculating a first length, the first length being a length of the first via between the first via stub and the second via stub; and calculating a second length, the second length being a length of a signal transmission pathway defined in the inner signal transmission layer and located between the first via and the second via;

wherein the PCB comprises two pairs of vias, each pair of vias comprising a corresponding first via and a corresponding second via; the signal input layer is located in a top outer layer of the PCB, and the signal transmission layer is located between the signal input layer and the inner signal transmission layer; the first via stub and the second via stub are located at opposite end portions of the first via, the first via stub opening through the top outer layer of the PCB, and the second via stub opening through a bottom outer layer of the PCB; the third via stub is located at an end portion of the second via and opens through the bottom outer layer of the PCB.

7. The method as in claim 6, wherein the length of the second via stub is equal to the length of the third via stub; when the length of the first via stub is greater than or equal to the length of the second and third via stubs, the characteristic impedance is designed first, the first length is calculated second, and the second length is calculated third; and when the length of the first via stub is less than the length of the second and third via stubs, the characteristic impedance is designed first, the second distance is calculated second, and the first distance is calculated third.

8. The method as in claim 7, wherein the characteristic impedance is designed to be higher than a differential impedance of the via system.

9. The method as in claim 8, wherein when the length of the first via stub is greater than or equal to the length of the second via stub, the first distance is calculated according to the following formula:

$$L1 = \frac{(\pi - |\varDelta \Gamma_A|)c}{2\pi f_1 \sqrt{\varepsilon_{\mathit{eff}}}}$$

wherein L1 is the first distance;

$f_1$ is set to be less than the quarter wavelength resonant frequency of the first via stub;

$\Gamma_A$ is a reflection coefficient of a first point in the signal transmission pathway;

$\epsilon_{\mathit{eff}}$ is the equivalent permittivity; and $c=3\times10^8$ m/s.

10. The method as in claim 9, wherein $\Gamma_A$ is calculated according to the following formula:

$$\Gamma_A = \frac{-jZ_0\tan\frac{2\pi f_1 \sqrt{\varepsilon_{\mathit{eff}}}}{c}L_{stub1}}{2Z_{via} + jZ_0\tan\frac{2\pi f_1 \sqrt{\varepsilon_{\mathit{eff}}}}{c}L_{stub1}}$$

wherein $Z_0$ is the impedance of the transmission pathway; and $Z_{via}$ is the characteristic impedance of all vias of the via system.

11. The method as in claim 10, wherein a value of the first distance can be adjusted according to signal requirements in order to obtain a maximum −3 dB insertion loss bandwidth.

12. The method as in claim 11, wherein the value of the first distance is represented by the following relationship:

½$L_{stub1} \leq L1 \leq 2*L_{stub1}$ wherein $L_{stub1}$ is the length of the first via stub.

13. The method as in claim 12, wherein the second distance is calculated according to the following formula:

$$L2 = \frac{(2\pi + \varDelta \Gamma_C + \varDelta \Gamma_A)c}{4\pi(f_2)\sqrt{\varepsilon_r}}$$

wherein L2 is the second distance;

$f_2$ is set to be less than $f_1$; and $\Gamma_A$ and $\Gamma_C$ are reflection coefficients of the first point and a third point, respectively, when the operating frequency equals $f_2$.

14. The method as in claim 13, wherein a value of the second distance can be adjusted according to a simulation in order to obtain an optimal bandwidth, and the value of the second distance is represented by the following relationship:

½$L_{stub1} \leq L2 \leq 2*L_{stub1}$.

15. The method as in claim 8, wherein when the length of the first via stub is less than the length of the second via stub, the second distance is calculated according to the following formula:

$$L2 = \frac{(\pi - |\varDelta \Gamma_D|)c}{2\pi f_1 \sqrt{\varepsilon_{\mathit{eff}}}}$$

wherein L2 is the second distance;

$f_1$ is set to be less than the quarter wavelength resonant frequency of the second via stub;

$\Gamma_D$ is a reflection coefficient of a fourth point located in the second distance, the fourth point being located adjacent to the third via stub;

$\epsilon_{\mathit{eff}}$ is the equivalent permittivity; and $c=3\times10^8$ m/s.

16. The method as in claim 15, wherein $\Gamma_D$ is calculated according to the following formula:

$$\Gamma_D = \frac{-jZ_0\tan\frac{2\pi f_1 \sqrt{\varepsilon_{\mathit{eff}}}}{c}L_{stub2}}{2Z_{via} + jZ_0\tan\frac{2\pi f_1 \sqrt{\varepsilon_{\mathit{eff}}}}{c}L_{stub2}}$$

wherein $Z_0$ is the impedance of the transmission pathway; and $Z_{via}$ is the characteristic impedance of all vias of the via system.

17. The method as in claim 16, wherein a value of the second distance can be adjusted according to signal requirements in order to obtain a maximum −3 dB insertion loss bandwidth.

18. The method as in claim 17, wherein the value of the second distance is represented by the following relationship:

$$\tfrac{1}{2} L_{stub2} \leq L2 \leq 2 * L_{stub2}$$

wherein $L_{stub2}$ is the length of the second via stub.

19. The method as in claim 18, wherein the length of the first distance is calculated according to the following formula:

$$L1 = \frac{(2\pi + \angle \Gamma_D + \angle \Gamma'_B) c}{4\pi (f_2) \sqrt{\varepsilon_r}}$$

wherein L1 is the first distance;
$f_2$ is set to be less than f1; and
$\Gamma_{B'}$ and $\Gamma_D$ are reflection coefficients of a second point and a fourth point, respectively, when the operating frequency equals $f_2$.

20. The method as in claim 19, wherein a value of the first distance can be adjusted according to a simulation in order to obtain an optimal bandwidth, and the value of the first distance is represented by the following relationship:

$$\tfrac{1}{2} L_{stub2} \leq L1 \leq 2 * L_{stub2}.$$

* * * * *